(12) United States Patent
Molas et al.

(10) Patent No.: US 12,349,609 B2
(45) Date of Patent: Jul. 1, 2025

(54) LOW FORMING VOLTAGE OxRAM MEMORY CELL, AND ASSOCIATED METHOD OF MANUFACTURE

(71) Applicants: COMMISSARIAT A L'ENERGIE ATOMIQUE ET AUX ENERGIES ALTERNATIVES, Paris (FR); WEEBIT NANO LTD, Hod-HaSharon (IL)

(72) Inventors: Gabriel Molas, Grenoble (FR); Thomas Magis, Grenoble (FR); Jean-François Nodin, Grenoble (FR); Alessandro Bricalli, Grenoble (FR); Guiseppe Piccolboni, Verona (IT); Yifat Cohen, Kiryat Tivon (IL); Amir Regev, Modiin (IL)

(73) Assignees: COMMISSARIAT A L'ENERGIE ATOMIZUE ET AUX ENERGIES ALTERNATIVES, Paris (FR); WEEBIT NANO LTD, Hod-HaSharon (IL)

( * ) Notice: Subject to any disclaimer, the term of this patent is extended or adjusted under 35 U.S.C. 154(b) by 555 days.

(21) Appl. No.: 17/777,494

(22) PCT Filed: Nov. 17, 2020

(86) PCT No.: PCT/EP2020/082390
§ 371 (c)(1),
(2) Date: May 17, 2022

(87) PCT Pub. No.: WO2021/099309
PCT Pub. Date: May 27, 2021

(65) Prior Publication Data
US 2022/0399496 A1    Dec. 15, 2022

(30) Foreign Application Priority Data
Nov. 21, 2019 (FR) .................................. 1912999

(51) Int. Cl.
*H10N 70/00* (2023.01)
*H10N 70/20* (2023.01)

(52) U.S. Cl.
CPC ......... *H10N 70/841* (2023.02); *H10N 70/063* (2023.02); *H10N 70/24* (2023.02)

(58) Field of Classification Search
CPC . H10N 70/841; H10N 70/826; H10N 70/8416
See application file for complete search history.

(56) References Cited

U.S. PATENT DOCUMENTS

| 2014/0264231 | A1  | 9/2014  | Wang et al. |
| 2017/0170394 | A1  | 6/2017  | Chen et al. |
| 2019/0385677 | A1* | 12/2019 | Pillarisetty ......... H10N 70/8416 |

OTHER PUBLICATIONS

International Search Report as issued in International Patent Application No. PCT/EP2020/082390, dated Dec. 15, 2020.

\* cited by examiner

*Primary Examiner* — Shih Tsun A Chou
(74) *Attorney, Agent, or Firm* — Pillsbury Winthrop Shaw Pittman LLP

(57) ABSTRACT

An OxRAM resistive memory cell includes a lower electrode, an upper electrode, and an active layer which extends between the lower electrode and the upper electrode. The active layer includes a layer of a first electrically insulating oxide, wherein an electrically conductive filament can be formed, then subsequently broken and reformed several times successively. The upper electrode includes a reservoir layer, capable of receiving oxygen, which includes an upper part made of a metal and a lower part made of a second oxide, the second oxide being an oxide of the metal and including a proportion of oxygen such that the second oxide is electrically conductive.

8 Claims, 5 Drawing Sheets

LOW FORMING VOLTAGE OxRAM MEMORY CELL, AND ASSOCIATED METHOD OF MANUFACTURE

CROSS-REFERENCE TO RELATED APPLICATIONS

This application is the U.S. National Stage of PCT/EP2020/082390, filed Nov. 17, 2020, which in turn claims priority to French patent application number 1912999 filed Nov. 21, 2019. The content of these applications are incorporated herein by reference in their entirety.

FIELD

The technical field of the invention is that of microelectronics, more particularly that of non-volatile resistive memories of the filamentary type.

The present invention more particularly relates to an oxide based resistive memory cell, of the OxRAM type (acronym for "Oxide-based resistive Random Access Memory") as well as a method for manufacturing such a cell.

BACKGROUND

New types of non-volatile memories, called resistive memories, or sometimes ReRAM (acronym for "Resistive Random Access Memory"), have been developed in the last few years. A memory of this type comprises different memory cells, sometimes called "memory points", that each store a piece of binary data. The binary data in question is represented by the level of resistance, either high, or low, of the memory cell considered.

Such a memory cell is generally manufactured by carrying out a stack of several layers, this stack comprising a lower electrode, an upper electrode, and an active layer which extends between the lower electrode and the upper electrode. The stack in question, of which the lateral dimensions are initially substantial, is etched in order to obtain several memory cells that are distinct from one another (this etching makes it possible to laterally delimit each memory cell). These are generally the upper electrode and the active layer that are etched in order to define the lateral dimensions of the "active" part of each memory cell (i.e. the part where the data to be stored is recorded).

In an OxRAM memory cell, such as the cell 1 shown in FIG. 1, the active layer 4 is made of a metal oxide or of a semiconductor oxide, EOx, for example a Hafnium or Silicon oxide. Initially, the active layer 4 is entirely electrically insulating. But a step called "forming" is then carried out, for each memory cell. During this step, an electrically conductive filament is formed in the active layer, by carrying out a sort of controlled breakdown of this layer. The filament thus formed then extends from one end to the other through the active layer, by electrically connecting the lower electrode 2 and the upper electrode 3.

To carry out this step of forming, it is possible for example to apply an electrical voltage between the lower electrode and the upper electrode of the memory cell considered, then progressively increasing the value of this voltage to a threshold voltage, called forming voltage $U_F$, beyond which a breakdown of the active layer is obtained.

Once formed, the conductive filament can be broken, then reformed, then broken again and so on, during successive write cycles (SET) then reset cycles (RESET), i.e. erasing of the memory cell (SET operations, when the filament is reformed, and RESET operations, when the filament is broken again). The threshold voltages to be applied to the memory cell to break the filament and to reform it (RESET and SET voltages), are generally lower than the forming voltage $U_F$, required to form the filament the first time.

The mechanism for forming the filament can entail a reorganisation of oxygen vacancies, within the oxide that forms the active layer. Also, in order to facilitate this reorganisation, a reservoir layer 5, able to store oxygen, is generally integrated in the upper electrode 3. This reservoir layer, which extends above the active layer 4, against the latter, is most often made of a metal M (non-oxidised) such as Titanium, Lanthanum, or Zirconium. The reservoir layer 5 is generally covered with a protective layer 6, for example made of a nitride MN of the metal in question.

In practice, it is interesting to etch memory cells that have reduced transverse dimensions, in order to increase the density of the information stored in the memory.

But it is observed in practice that the forming voltage $U_F$, that must be applied in order to create the conductive filament the first time, increases when the section of the memory cell decreases. This increase is rather progressive for sections ranging from 1 $\mu m^2$ to about 100×100 $nm^2$. But below a dimension of about a hundred of nanometres, a quick increase in the forming voltage $U_F$ is observed when the section of the memory cell decreases (more precisely, when the surface area of the upper electrode decreases). This increase then leads to high values of the forming voltage $U_F$, for example greater than 5 or 6 volts, much higher than the SET and RESET voltages of the memory cell which are typically less than 1, or 2 volts.

In order to carry out the forming operation, the chip that receives the memory must then be equipped with additional electronics dedicated specifically to the forming operation, making it possible to deliver high electrical voltages (in addition to the control electronics of the memory cells, which makes it possible to carry out the SET and RESET operations). These additional electronics then increase the cost of manufacturing the memory, and the dimensions that it occupies on the electronic chip.

It therefore would be useful to reduce the forming voltage $U_F$ of such memory cells, without however increasing the surface that each one of these cells occupies.

SUMMARY

In this context, the invention proposes an OxRAM resistive memory cell that comprises a reservoir layer of a particular type, thanks to which the forming voltage $U_F$ of the cell can be reduced, without however increasing the surface that the cell occupies.

More particularly, the invention proposes an OxRAM resistive memory cell comprising a lower electrode, an upper electrode, and an active layer which extends between the lower electrode and the upper electrode, the active layer comprising at least one layer of a first electrically insulating oxide, wherein an electrically conductive filament can be formed, then subsequently broken and reformed several times successively, the upper electrode comprising a reservoir layer capable of receiving oxygen, a portion at least of the reservoir layer being made of a metal, wherein said reservoir layer comprises an upper part made of said metal and a lower part made of a second oxide, the second oxide being an oxide of said metal and comprising a proportion of oxygen such that the second oxide is electrically conductive, with an electrical conductivity greater than 100 Siemens per metre.

The inventors have observed that the lower part of the reservoir layer, made of the second oxide conductor, makes it possible to notably reduce the forming voltage $U_F$ of the memory cell with respect to a memory cell with the same external dimensions but devoid of this part made of conductive oxide (the decrease in the forming voltage in question is shown in FIG. 9, by way of example, for a first type of memory cell in accordance with the teachings of the invention).

An explanation of the improvement provided by this particular reservoir layer is presented hereinbelow, after having discussed mechanisms that can be responsible for high values of forming voltage $U_F$, usually obtained for cells with a small section.

First of all, it can be noticed that the "forming" operation is based on a controlled breakdown mechanism of the oxide EOx of the active layer 4. This breakdown is linked to the formation of defects in the active layer, defects that lead to the formation of a conductive path. However this formation of defects is all the more likely when the transverse section of the cell is large. Formulated otherwise, the smaller the section of the cell is, and the less locations there are that are appropriate for triggering, or in other words, initiating the breakdown in question, and so a higher electrical voltage is then necessary to obtain the breakdown.

This effect is accentuated by the lateral etching of the memory cell, more or less pronounced depending on the layer considered. Indeed, in a cell of the prior art such as that shown in FIG. 1, the reservoir layer 5, made entirely of the metal M, is less resistant to the etching than the other layers of the memory (made of the nitride of said metal, MN, or made of the oxide EOx). After etching, the reservoir layer 5 therefore has a section that is smaller than the active layer 4 and smaller than the upper face of the memory cell. This lateral etching which is more pronounced for the metal layer 5, sometimes called "undercut" (or "notching"), is schematically shown in FIG. 1. For cells with a large section, the reduction in the section of the reservoir layer 5 due to this differential etching remains low, in relative value. On the other hand, for a memory cell of small dimensions, for example a cell with a dimension of 40 nm, this "undercut" effect can make the surface area $A_M$ of the section of the reservoir layer 5 almost four times smaller than the surface area $A_T$ of the upper face of the memory cell.

The electrical potential, applied on the upper face of the active layer 4 in order to obtain the breakdown of this layer, is therefore finally applied (via the reservoir layer 5) on an effective surface $A_M$ that is much smaller than the apparent surface $A_T$ occupied by the memory cell (an apparent surface that moreover is small itself). This explains the particularly high values of forming voltage observed for memory cells for which the upper face has a surface area of about 100×100 nm$^2$ or less.

The particular structure of the reservoir layer of the memory cell in accordance with the invention makes it possible to overcome at least partially the section reduction (i.e. the "undercut") described hereinabove, which makes it possible to lower the forming voltage of the cell.

Indeed, for the metals that are usually used as a reservoir layer, for example Titanium, Lanthanum, or Zirconium, the formation enthalpy corresponding to a metal-metal bond M-M is less than that corresponding to a metal-oxygen bond M-O. Moreover, the metal-oxygen bond M-O in question has a formation enthalpy greater than that of a metal-Chlorine bond M-Cl (Chlorine which is frequently used as a plasma etching agent, during the manufacture of this type of memories).

In a memory cell in accordance with the invention, the second oxide MOy is therefore a priori more resistant to etching, in particular to a halogenated plasma etching, than the metal M itself. And it is moreover observed in practice that the "undercut" of the reservoir layer is lower for the part made of oxide MOy than for the part made of metal M.

Thanks to its part made of conductive oxide MOy, this reservoir layer thus has after etching, under the metal M, a zone that is electrically conductive and that has a transverse section that is larger than what would have been obtained with a layer made only of the metal M. The particular reservoir layer used here thus makes it possible to both:
  obtain the desired "oxygen reservoir" effect, thanks to its upper part made of said metal, and
  apply a given electrical potential on the upper face of the active layer, on an effective surface that is greater than the surface area $A_M$ of the section of the upper part made of metal (thanks to the nature both conductive and resistant to the etching of the second oxide MOy).

The relatively high electrical conductivity of the part made of conductive metal oxide, greater than 100 Siemens per metre, makes it possible to effectively use most of the section of this part made of metal oxide (section advantageously larger than that of the part made of metal M) to exert the electrical potential in question on the upper face of the active layer.

The particular reservoir layer used here thus makes it possible, for a given surface area $A_T$ of the upper face of the memory cell, and therefore for a given size of the memory cell, to reduce the forming voltage $U_F$, with respect to a cell of the prior art, such as that shown in FIG. 1, for example.

In addition to the characteristics that have just been mentioned above, the memory cell according to an aspect of the invention can have one or more of the following, optional additional features, taken individually or according to any technical permissible combinations:
  the reservoir layer comprises a proportion of oxygen that varies progressively from the lower part of the reservoir layer to its upper part;
  the lower part of the reservoir layer is made of a first sub-layer made of said second oxide, and the upper part of the reservoir layer is made of a second sub-layer, distinct from the first sub-layer and made of said metal;
  the cell having been delimited laterally by etching, the lower part of the reservoir layer, made of the second oxide, has a section that is larger than the section of the upper part of the reservoir layer, made of said metal, for example at least 20% larger;
  said metal is one of the following metals: Titanium, Tantalum, Gadolinium, Lanthanum, Aluminium, Zirconium, Hafnium;
  the first oxide is an oxide of a chemical element different from said metal;
  said metal is Titanium and the proportion of oxygen in the second oxide is less than 1.7 Oxygen atoms per Titanium atom;
  the first oxide is a Silicon oxide;
  an upper face of the memory cell has a surface area less than 1 square micron, even less than 0.1 square micron or even less than 0.01 square micron.

Another aspect of the invention relates to a method for manufacturing an OxRAM resistive memory cell, comprising the following steps:
  depositing a lower electrode, then
  depositing an active layer on the lower electrode, the active layer comprising at least one layer made of a first oxide, the first oxide being electrically insulating and able to be used as a support for the formation of an electrically conductive filament passing through said first oxide, the filament being able to be broken then reformed several times successively, then producing an upper electrode covering the active layer, by executing the following steps:
  producing a reservoir layer capable of receiving oxygen, a portion at least of the reservoir layer being made of a metal, and
  etching the upper electrode in such a way as to laterally delimit the memory cell, the step of etching being carried out after the step of producing said reservoir layer, wherein the step of producing the reservoir layer is carried out in such a way that the reservoir layer comprises an upper part made of said metal, and a lower part made of a second oxide, the second oxide being an oxide of said metal comprising a proportion of oxygen such that the second oxide is electrically conductive, with an electrical conductivity greater than 100 Siemens per metre.

In addition to the characteristics that have just been mentioned in the preceding paragraph, the memory cell according to an aspect of the invention can have one or more additional characteristics from among the following, taken individually or according to any technical permissible combination:

the step of producing the reservoir layer comprises the following sub-steps:
  depositing a layer of said metal on the active layer, then
  carrying out an annealing at a temperature and for a duration such that the previously deposited layer includes, after annealing: said upper part made of said metal, as well as said lower part made of the electrically conductive second oxide;
the step of producing the reservoir layer comprises the following sub-steps:
  depositing a first sub-layer on the active layer, the first sub-layer being made of the second oxide, then
  depositing a second sub-layer on the first sub-layer, the second sub-layer being made of said metal;
the sub-step of depositing the first sub-layer is carried out by cathodic sputtering from a target made of said electrically conductive second oxide;
the sub-step of depositing the first sub-layer is carried out by cathodic sputtering from a target made of said metal, under an atmosphere comprising oxygen, the oxygen partial pressure in said atmosphere being such that the first sub-layer deposited is made of said second oxide, with said proportion in oxygen;
the step of etching is a halogenated plasma etching;
said plasma is a chlorine and/or hydrogen bromide plasma.

The invention and its different applications shall be better understood when reading the following description and examining the accompanying figures.

BRIEF DESCRIPTION OF THE FIGURES

The figures are shown for the purposes of information and in no way limit the invention.

DETAILED DESCRIPTION

Figure 5:
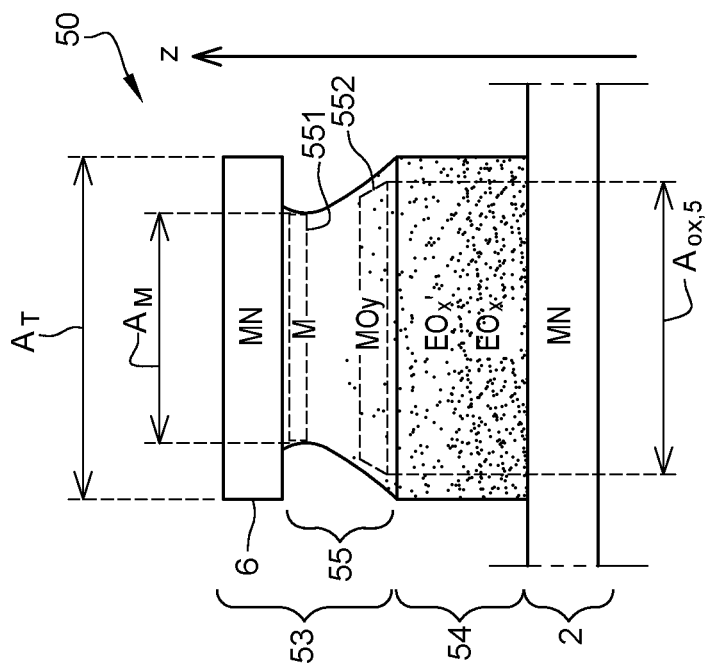
FIG. 5 schematically shows the memory cell of FIG. 3, once etched.
Figure 6:
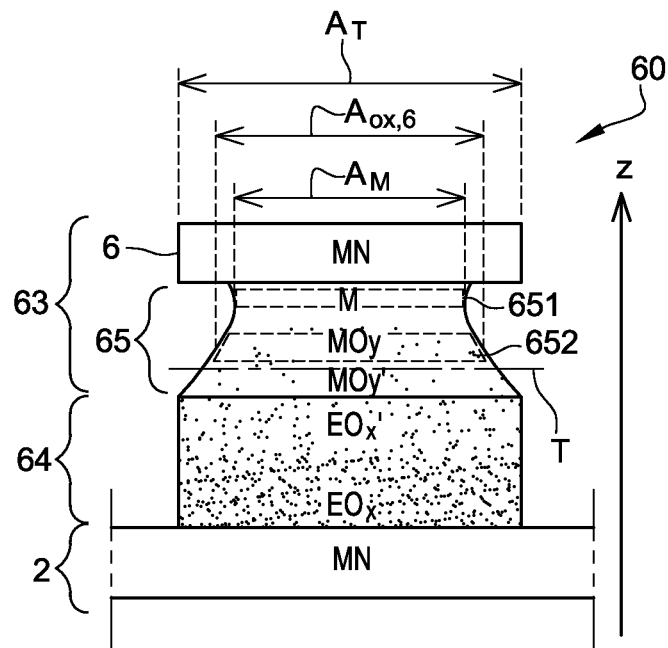
FIG. 6 schematically shows an alternative of the memory cell of FIG. 5.
Figure 8:
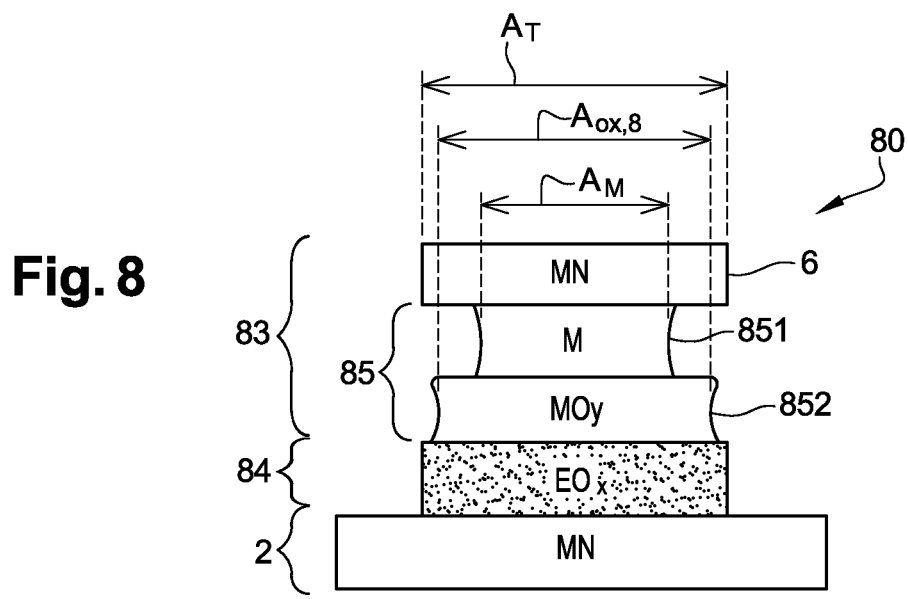
FIG. 8 schematically shows a second type of OxRAM resistive memory cell in accordance with the teachings of the invention, carried out thanks to the method of FIG. 7.

As already mentioned, the invention relates to an OxRAM resistive memory cell, comprising a lower electrode 2, an upper electrode 53; 63; 83, and an active layer 54; 64; 84 which extends between the lower electrode and the upper electrode (see FIGS. 5, 6 and 8).

The active layer 54; 64; 84 comprises at least one layer of an electrically insulating first oxide EOx. This first oxide EOx is an adequate support for the formation of an electrically conductive filament, that passes through the active layer from one side to the other to electrically connect the lower electrode to the upper electrode, and which can be broken then reformed several times successively during successive write and erase (RESET), i.e. resetting, cycles of the memory. As explained in the preamble, this conductive filament is produced a first time during a kind of controlled electrical breakdown of the active layer ("forming" operation).

The first oxide EOx mentioned hereinabove is a metal oxide or a semiconductor oxide, stoichiometric or sub-stoichiometric. This is an oxide of a chemical element E which can therefore be a metal or a semiconductor and that can for example be chosen from: Hafnium Hf, Zirconium Zr, Titanium Ti, Tantalum Ta, Niobium Nb, Vanadium V, Tungsten W, Molybdenum Mo, Aluminium Al, Gadolinium Gd, or Silicon Si.

The active layer can be made of a same insulating layer, of oxide EOx (case of the active layer 84 of FIG. 8).

The active layer can also be made, in the lower part, of the first oxide EOx, and, in the upper part, of an oxide EOx' of the same chemical element E, but with a fraction x' of oxygen that is lower than in the first oxide EOx (case of FIGS. 5 and 6)

Alternatively, the active layer could also be formed by a stack of several insulating sub-layers, made of oxides of different elements chosen from the list mentioned hereinabove. By way of example, this stack could comprise a sub-layer of Hafnium oxide HfOx, and, above, a sub-layer of aluminium oxide $Al_2O_2$. For this alternative, one of the sub-layers of the stack in question is then made of the first oxide EOx.

The forming mechanism of the conductive filament, in the oxide EOx layer, generally entails a reorganisation of oxygen vacancies, within this oxide. In order to facilitate this reorganisation, the upper electrode 53; 63; 83 comprises a reservoir layer 55; 65; 85 capable of receiving oxygen (sometimes called "getter"). A part at least of this reservoir layer 55; 65; 85 is made of a metal M (not or little oxidised) which can be Titanium Ti, Lanthanum, Aluminium, Zirconium, Gadolinium, Tantalum or Hafnium. Preferably, the metal M is Titanium Ti, particularly well-suited for carrying out such a reservoir layer.

The reservoir layer 55; 65; 85 extends above the active layer 54; 64; 84 and covers it. Here, the reservoir layer extends directly on the active layer 54; 64; 84, against the latter, with no intermediate layer between them (which facilitates the oxygen exchanges between these two layers). Alternatively, one or more intermediate layers, at least partially permeable to oxygen, could be inserted between the active layer and the reservoir layer.

The upper electrode 53; 63; 83 can, as here, comprise one or more additional layers, in addition to the reservoir layer 55; 65; 85.

Here, the upper electrode 53; 63; 83 comprises an upper layer 6, that covers the reservoir layer 55; 65; 85 (see FIGS. 5, 6 and 8). The upper layer 6 plays both the role of a protective layer (preventing in particular a total oxidation of the reservoir layer), and the role of a contact layer making it possible to electrically connect the memory cell to its control and read electronic circuit. The upper layer 6 is more resistant to the etching than the part of the reservoir layer 55; 65; 85 made of the metal M. Here, the upper layer 6 is made of a nitride MN of the metal M mentioned hereinabove (this upper layer can thus be made, for example, of Titanium nitride TiN).

The lower electrode 2, deposited on a substrate (not shown), comprises a metal layer that is neutral with respect to oxygen, for example a layer made of a nitride MN of the metal M, or made of a nitride of another metal (typically, made of titanium nitride TiN, made of tungsten W or made of Tantalum nitride TaN).

Here, the various layers of the memory cell 50; 60; 80 are parallel to one another (and parallel to the substrate in question). They together form a stack that extends along an axis z perpendicular to the plane of the layers. The various layers of the memory cell 50; 60; 80 thus occupy different positions (different coordinates) along the axis z.

Remarkably, the reservoir layer 55; 65; 85 mentioned hereinabove comprises an upper part 551; 651; 851 made of the metal M, and a lower part 552; 652; 852 made of a second oxide MOy. The second oxide MOy is an oxide of said metal M and comprises a proportion y in oxygen such that this second oxide is electrically conductive.

As explained in the part entitled "summary of the invention", the second oxide MOy is both electrically conductive, and more resistant to the etching than the metal M that forms the upper part of the reservoir layer 55; 65; 85.

Once the memory cell 50; 60; 80 has been delimited laterally by etching, the lower part 552; 652; 852 of the reservoir layer 55; 65; 85 (made of the second oxide MOy) therefore has a section that is larger than the upper part 551; 651; 851 of the reservoir layer (made of the metal M), due to its better resistance to lateral etching (see FIGS. 5, 6 and 8).

This lower part 552; 652; 852 of the reservoir layer 55; 65; 85, made of the second oxide MOy, thus makes it possible:

for the reservoir layer, to keep its function of oxygen storage (in particular thanks to its upper part made of the metal M), while still benefiting, above the active layer 54; 64; 84, from an electrically conductive zone with a section that is larger than the upper part made of metal M (thanks to the nature, both conductive and resistant to etching, of the second oxide MOy).

As explained in the part "summary of the invention" the extended nature of this conductive zone 552; 652; 852 advantageously makes it possible to reduce the value of the forming voltage $U_F$ to be applied to the memory cell in order to create the electrically conductive filament that passes through the active layer 54; 64; 84. The forming voltage $U_F$ of this memory cell 50; 60; 80 is in particular lower than that of a memory cell that would have an upper face with the same section, but wherein the reservoir layer would be made only of metal (less resistant to etching than the oxide MOy).

Carrying out this zone 552; 652; 852, both conductive and resistant to etching, from a metal oxide that is an oxide of the same metal as the metal M forming the upper part 551; 651; 851 of the reservoir layer, allows for convenient manufacture of the memory cell.

In practice, after etching, when the memory cell 50; 60; 80 has a small section (typically less than $10^{-2}$ square microns), the lower part 552; 652; 852 of the reservoir layer 55; 65; 85 (made of oxide MOy) has a section whose surface area $A_{OX,5}$; $A_{OX,6}$; $A_{OX,8}$ is at least 20% greater than the surface area $A_M$ of the section of the upper part 551; 651; 851 of the reservoir layer, made of metal M. And even, when the memory cell 50; 60; 80 has a diameter of about forty nanometres (diameter of its upper layer 6), the surface area $A_{OX,5}$; $A_{OX,6}$; $A_{OX,8}$ of the lower part made of oxide MOy can be twice as large (and even more) than the surface area $A_M$ of its upper part (made of metal M). The sections mentioned hereinabove are sections of the memory cell, according to cutting planes parallel to the lower electrode 2, and therefore perpendicular to the axis z introduced previously. These are somewhat "complete" sections of the memory cell (at the cutting plane considered), delimited by the external lateral surface of the memory cell.

Note that the second oxide MOy, that forms the lower part of the reservoir layer 55; 65; 85, is indeed distinct from the first oxide EOx of the active layer 54; 64; 84.

Indeed, the electrical conductivity σ2 of the second oxide MOy (which is electrically conductive) is here higher, and even much higher than that, σ1, of the first oxide EOx (which is electrically insulating, except at the conductive filament mentioned hereinabove). The electrical conductivity σ2 of the second oxide MOy, is for example greater than or equal to 100 Siemens per metre. And, in practice, it is generally at least one thousand times, even one million times greater than that, σ1, of the first oxide EOx. Furthermore, the metal M of the reservoir layer, which makes it possible to store the oxygen coming from the layer made of first oxide EOx, is here different from the element E present, in oxidised form (EOx), in the active layer 54; 64; 84. By way of example, the metal M can be Titanium Ti while the active layer is then carried out in silicon oxide SiOx.

Besides the part of the reservoir layer made of the second oxide MOy has a composition that is also very different from that of the upper part of the reservoir layer, made of the metal M.

Indeed, even if this upper part 551; 651; 851 possibly comprises a small quantity of oxygen, the relative difference between, on the one hand, the quantity y of oxygen present in the second oxide MOy, and, on the other hand, the quantity E of oxygen possibly present in said upper part, is here greater than 50%, even greater than 70%. Formulated otherwise, the quantity $(y-\varepsilon)/(y+\varepsilon)$ is here greater than 0.5, even greater than 0.7, y being the number of oxygen atoms per atom of metal M in the second oxide MOy, and E being the number of oxygen atoms per atom of metal M in the upper part made of metal M (i.e., more precisely, in the upper part of the reservoir layer, mainly made of said metal M, non-oxidised, or only slightly oxidised).

By way of example, when the metal M is Titanium, the proportion y of oxygen in the second oxide MOy can be comprised between 1 and 1.7, which makes it possible to obtain an electrical conductivity σ2 greater than 100 Siemens per metre, with the quantity E of oxygen possibly present in said upper part made of metal being less than 0.5, even less than 0.2.

) The second oxide is marked with the reference MOy, in the figures. But its chemical (empirical) formula can be MOy (case with Titanium oxide TiOy, Hafnium oxide HfOy, or Zirconium oxide ZrOy, for example), as well as $M_2O_z$ (with z=2y), for example (case with aluminium oxide $Al_2O_{z<3}$, for example).

At least two different techniques can be considered for carrying out the particular reservoir layer 55; 65; 85 mentioned hereinabove. A first technique is based on a specific annealing, carried out before the etching of the memory cell. A second technique is based on successive depositions of several distinct sub-layers comprising proportions in oxygen that are different from one another (for example a first sub-layer, then a second sub-layer).

Figure 10:
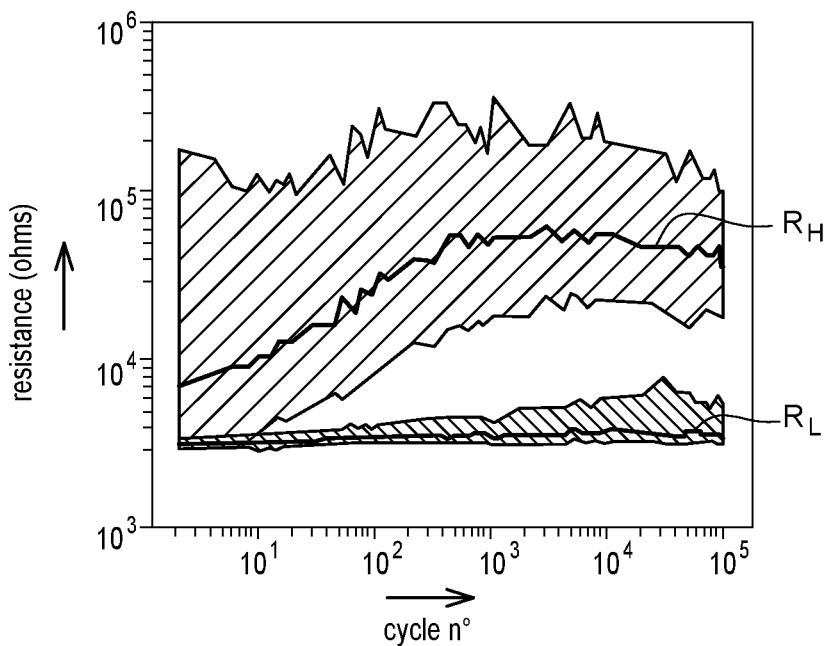
FIG. 10 shows the values of a low resistance and of a high resistance of a memory cell of the prior art, such as that of FIG. 1, obtained during several successive write and erase cycles of the memory cell.
Figure 11:
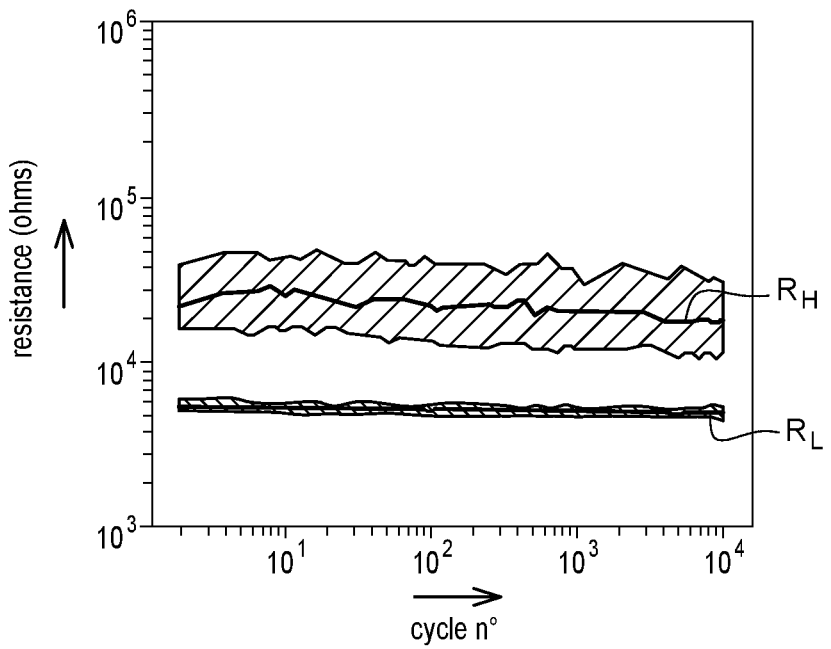
FIG. 11 shows the values of a low resistance and of a high resistance of a memory cell in accordance with the teachings of the invention, obtained during several successive write and erase cycles of the memory cell.

A first method of manufacturing corresponding to the first technique (by annealing), as well as examples of memory cells obtained in this way are presented hereinbelow, in a first step (FIGS. 2 to 6). A second method of manufacturing corresponding to the second technique (by successive depositions) is then presented, in reference to FIGS. 7 and 8. Finally, measurement results showing the drop in forming voltage obtained are presented, in reference to FIG. 9, as well as results of endurance tests (FIGS. 10 and 11).

Figure 2:
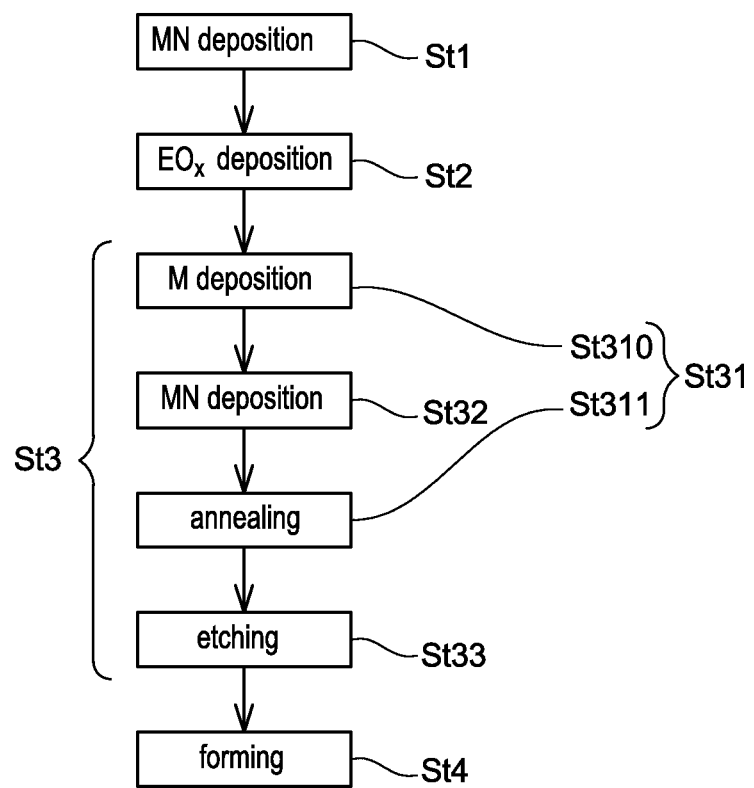
FIG. 2 schematically shows different steps of a first method of manufacturing an OxRAM resistive memory cell, in accordance with the teachings of the invention.

Such as shown in FIG. 2, the first method of manufacturing comprises the following steps:

step St1: depositing the lower electrode 2, then step St2: depositing the active layer on the lower electrode 2, then step St3: producing the upper electrode 53; 63 that covers the active layer, then step St4: forming an electrically conductive filament in the active layer, by controlled electrical breakdown of the active layer (step of forming).

The step St3, of producing the upper electrode 53; 63 is carried out more precisely by executing the following steps:

step St31: producing the reservoir layer 55; 65 (intended to be capable of receiving oxygen coming from the active layer) thanks to the annealing technique mentioned hereinabove;

step St32: depositing the protective layer 6 that covers the reservoir layer 55; 65, and step St33: etching the upper electrode 53; 63, as well as the active layer 54; 64, in such a way as to laterally delimit the memory cell 50; 60.

At the step St31, for producing the reservoir layer 55; 65, it is provided to execute the following sub-steps:

St310: depositing a layer 35 of said metal M on the active layer, then

St311: carrying out the annealing mentioned hereinabove.

As can be seen in FIG. 2, the annealing operation, St311, is here carried out after the deposition of the layer 35 made of metal M, and even after the deposition of the upper protective layer 6, made of Nitride MN. Alternatively, the annealing operation could however be carried out after the deposition of the layer 35 made of metal M, but before the deposition of the upper protective layer (in the framework of this alternative, the steps St310, St311 and St32 would then be executed in the following order: St310, then St311 then St32). In the framework of this alternative, the annealing must however be carried out without exposure to air of the memory, and this until the deposition of the upper protective layer (the annealing then being carried out in an oxygen-free atmosphere, or in a vacuum).

Figure 3:
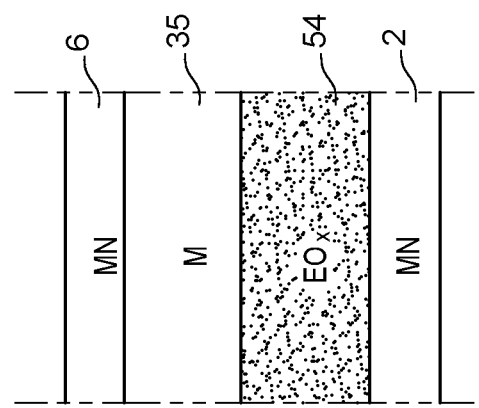
FIG. 3 schematically shows a first type of OxRAM resistive memory cell in accordance with the teachings of the invention, carried out thanks to the method of FIG. 2, at an intermediate stage of its manufacture.

Here, the layer 35 made of metal M is directly deposited on the active layer, against the latter (with no intermediate layer). FIG. 3 schematically shows the stack carried out, before annealing, and before etching (i.e. immediately after the sub-step St32).

During the annealing, the high temperature (or the temperatures) applied to the memory cell allows for a diffusion of oxygen from the active layer to the layer 35 made of metal M (initially without oxygen).

Figure 4:
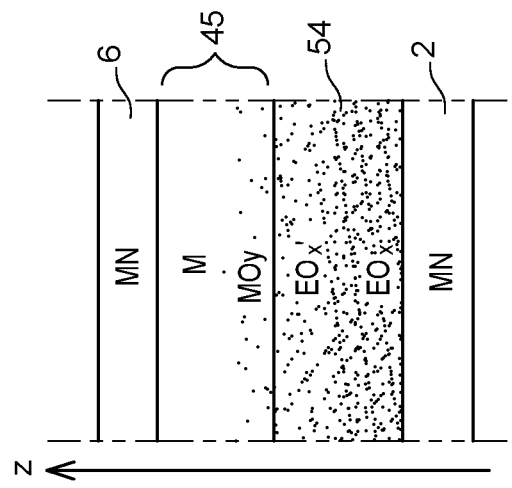
FIG. 4 schematically shows the memory cell of FIG. 3, at a more advanced stage of its fabrication.

After annealing, instead of the initially deposited layer 35 made of metal M, a layer 45 is then obtained comprising, in the lower part, the oxide MOy, and in the upper part, the metal M. FIG. 4 schematically shows the stack of layers of the memory cell, after annealing, and before etching (for a relatively short annealing duration, for which the part of the layer 45, located the lowest in this layer, remains electrically conductive).

The reservoir layer 55; 65, obtained according to this annealing technique, has a proportion in oxygen that increases progressively, from the bottom to the top of the layer (c.f.: FIGS. 5 and 6). Within the reservoir layer, the concentration in oxygen thus increases progressively, continuously, with the coordinate z of the point considered (the concentration in oxygen can for example have a non-zero gradient over the entire thickness of the reservoir layer).

The duration, and the temperature or temperatures for annealing are chosen here in such a way as not to oxidise the upper part of the layer 35, or at the least, in such a way as to oxidise it only very little (for this, the annealing duration is limited to a value that is not excessively high). Thus, after annealing, in the part of the layer 45 located at the very top of the latter, the proportion of oxygen is preferably less than 0.5, or even less than 0.2 oxygen atoms per atom of metal M.

The duration and the temperature or temperatures for annealing are chosen in such a way that, in the lower part of the layer 45, made of the second oxide MOy, the proportion y of oxygen is at least greater than 1 (in this lower part, the metal M is at least partially oxidised—to increase the resistance to etching of this part), while remaining low enough so that the second oxide MOy is electrically conductive.

By way of example, for a reservoir layer with a thickness comprised between 1 and 15 nanometres, an annealing temperature comprised between 220 and 280 degrees Celsius, preferably 260 degrees Celsius, and an annealing duration of 1 to 10 minutes, preferably 3 minutes, make it possible to obtain the desired structure for the reservoir layer, with an upper part made of metal M, and a lower part made of the second oxide MOy.

After the annealing sub-step St311, the memory cell is etched, to laterally delimit the upper electrode 53; 63 and the active layer 54; 64. This etching is a halogenated plasma etching. Here, this is more precisely a chlorine Cl2 and hydrogen bromide HBr plasma etching.

This type of etching is sufficiently efficient for etching the upper layer of the electrode, made of Nitride MN. As the formation enthalpy of a metal-metal bond M-M is less than that corresponding to a metal-oxygen bond M-O, the part of the reservoir layer 55; 65 made of the second oxide MOy is therefore less etched laterally than its upper part made of metal M (c.f.: FIGS. 5 and 6).

Moreover, for most of the metals in the list wherein the metal M can be chosen (list that comprises the following elements: Ti, La, Al, Zr, Hf, Ta, Gd as already indicated), the formation enthalpies corresponding to the metal-metal M-M, metal-nitrogen M-N, metal-Chlorine M-Cl and metal-oxygen M-O bonds follow the following order: M-M<M-N<M-Cl<M-O, which explains the good resistance to the etching of the lower part 552; 652 of the reservoir layer 55; 65 made of the second oxide MOy.

In practice, during the step of etching, several memory cells are etched at the same time. During this etching, it can be provided not to etch the lower electrode 2 so that it remains common to the different memory cells of the memory. The lower electrode could however be etched too, either during this same step of etching, or during a preceding step of structuring the lower electrode 2 (not shown in FIG. 2), carried out for example between the deposition of the lower electrode 2 (step St1) and the deposition of the active layer (step St2.

After the step of etching St33, a control electronics of the different memory cells is generally manufactured (this step is not shown, in the figures). These electronics make it possible in particular to carry out the forming operation St4.

During the step of forming St4, the electrically conductive filament mentioned hereinabove is formed, for the first time, in the active layer 54; 64. For this, an electrical voltage is applied between the lower electrode 2 and the upper layer 6 of the memory cell. The value of this voltage is progressively increased, until it becomes greater than the forming voltage $U_F$, for which the conductive filament is formed in the active layer. Alternatively, the step of "forming" could be carried out by injecting a controlled electrical current into one of the electrodes of the memory cell, with the value of this current being increased progressively until the conductive filament is formed. More generally, the step of "forming" can be carried out by controlling the voltage and/or the current applied to the memory cell, according to a predetermined control cycle. But regardless of the control mode chosen (with current, with voltage, or mixed), during this step, the electrical voltage between the lower electrode 2 and the upper layer 6 of the memory cell is made higher than the forming voltage $U_F$.

FIG. 5 shows a first example of a memory cell 50 obtained by this first method, after etching.

For this first example, the annealing is relatively short, so that the part of the reservoir layer 55 located the lowest in this layer remains rather little oxidised, and therefore electrically conductive. The part of the reservoir layer designated hereinabove as the "lower part 552 of the reservoir layer>>, made of the second oxide conductor MOy, then corresponds to this part of the reservoir layer 55 located at the very bottom of the reservoir layer. The lower part 552 of the reservoir layer thus occupies a zone that extends directly against the upper face of the active layer 54, over a thickness representing a fraction of the total thickness of the reservoir layer. This zone extends over the entire section of the reservoir layer, i.e. to its external lateral surface. Even if it is not separated from the rest of the reservoir layer by an abrupt boundary, the lower part 552, made of conductive oxide MOy, therefore forms a sort of stratum, parallel to the lower electrode 2.

The upper part 551 of the reservoir layer occupies a zone located at the very top of the reservoir layer 55, and which extends over a thickness that represents a fraction of the total thickness of the reservoir layer. This zone extends, too, over an entire section of the memory cell (to the external lateral surface of the memory cell), by forming a sort of stratus parallel to the lower electrode 2.

The annealing which, in the reservoir layer, makes it possible to obtain the lower part 552 made of conductive oxide MOy, also has for effect to slightly modify the active layer 54. Due to the annealing, a difference in the concentration of oxygen appears between the bottom and the top of the active layer 54. In its upper part, the active layer 54 thus comprises a proportion in oxygen x' that is lower than the proportion in oxygen x in its lower part. The lower part of the active layer 54, made of the first oxide EOx, however remains completely electrically insulating (except at the electrically conductive filament mentioned hereinabove).

After etching, the upper layer 6 of the memory cell 50 (made of nitride MN) has a section with a surface area $A_T$ (this is the surface area of the upper face of this layer). The upper part 551 of the reservoir layer 55, less resistant to etching, has a section with a surface area $A_M$ that is notably smaller than the surface area $A_T$ of the upper layer (marked "undercut" effect). The lower part 552 of the reservoir layer, which is more resistant to the lateral etching, has a section of surface area $A_{ox,5}$ that is much greater than that, $A_M$, of the upper part 551 of the reservoir layer, made of metal M. The surface area $A_{ox,5}$ of the section of the lower part 552 is close to the surface area of the section of the active layer 54 (even equal to the surface area of the section of the active layer 54). As explained in detail hereinabove, this makes it possible to greatly reduce the value of the forming voltage $U_F$, with respect to the case of a reservoir layer that would be made entirely of the metal M.

Regarding the lower electrode 2, whether or not it has been etched, its section is more extended that that of the active layer 54, and than that of the section of the upper layer 6. It is therefore the lateral dimensions of the upper electrode and of the active layer that define the lateral extension of the "active" part of the memory cell.

FIG. 6 shows a second example of the memory cell 60, obtained by the first method described hereinabove, after etching. The duration of the etching is greater for this second example, than for the first example of FIG. 5.

Due to this more substantial annealing duration, the part of the reservoir layer 65 that is located the lowest in this layer, against the active layer 64, is then electrically insulating.

But as the concentration in oxygen decreases progressively from the bottom to the top of the reservoir layer 65, starting from a certain height, the material that forms the reservoir layer becomes conductive. In other terms, starting from this height, the concentration in oxygen is low enough for this material to correspond to the second oxide MOy, electrically conductive.

For this second example, the reservoir layer 65 therefore comprises:
- at the very bottom, an insulating part, made of a third oxide MOy', which is an oxide of the metal M with a proportion in oxygen y' such that the third oxide is electrically insulating,
- at the very top, said upper part 651, made of the metal M, and
- between the insulating part and the upper part 651, said lower part 652, made of the second oxide MOy, electrically conductive.

When the metal M is Titanium, then third oxide can have for chemical formula $TiO_2$, or, more generally $TiO_{y'>1,7}$.

In FIG. 6, the transition between the insulating part and the conductive part of the reservoir layer 65 is schematically represented by a line, which bears the reference T. This transition can correspond for example to the passing from an electrical conductivity less than 100 Siemens per metre, to an electrical conductivity greater than 100 Siemens per metre.

It can be seen on this example that the part of the reservoir layer 65 designated as "the lower part of the reservoir layer" is certainly located below the upper part made of metal, but not necessarily at the very bottom of the reservoir layer. Here, the lower part 652 of the reservoir layer (made of conductor oxide MOy) more precisely occupies the zone located immediately above the transition T between the insulating part and the conductive part.

In any case, the lower part 652 of the reservoir layer, made of the second oxide MOy occupies a zone that extends over the entire section of the reservoir layer (i.e. to its external lateral surface) and over a thickness that represents a fraction of the total thickness of the reservoir layer, as for the memory cell 50 of FIG. 5.

After etching, the upper layer 6 of the memory cell 60 (made of nitride MN) has, once again, a section with surface area $A_T$. The upper part 651 of the reservoir layer, less resistant to the etching, has a section with a surface area $A_M$ that is notably smaller than the surface area $A_T$ of the upper layer (marked "undercut"). And the lower part 652 of the reservoir layer, more resistant to the lateral etching, also has a section of surface area $A_{ox,6}$ that is much larger than the surface area $A_M$ of the section of the upper part 651 made of metal M.

Thus, despite the formation of an isolating part at the very bottom of the reservoir layer 65, above the active layer 64, an electrically conductive zone is even so obtained, with a surface area $A_{ox,6}$ that is larger than the part made of metal 651, which makes it possible to reduce the value of the forming voltage $U_F$ (because the corresponding electrical potential is applied, above the active layer, on a surface area that is larger than with a reservoir layer entirely made of metal M).

Regarding the lower electrode 2, likewise for the memory cell of FIG. 5, its section is more extended than that of the active layer 54, and than that of the upper layer 6.

The comparison of the first and second examples of memory cells 50, 60 shows that the duration of the annealing, more or less long, can be chosen with a certain degree of freedom, as long as the top of the reservoir layer (substantially made of metal M) remains little oxidised while the bottom of this layer is at least partially oxidised (with at least one oxygen atom per atom of metal M, for example).

An annealing duration and temperature, which make it possible to obtain the reservoir layer 55 or 65 described hereinabove, can be determined by conducting tests, for several different durations, for example, until the desired reduction in the forming voltage (see FIG. 9) is obtained. During these tests, the structure of the reservoir layer can possibly be probed (for example by making sections of the "EdX" type, i.e. by a characterisation method of the "Energy Dispersive X-ray" type) in order to test its chemical composition.

It is to be noted again that the sub-step St311 of annealing is carried out before the step of etching of the memory cell St 33, so that the lower part 552; 652 of the reservoir layer has acquired a good resistance to the etching before etching the cell.

This first method of manufacturing can comprise additional steps, in addition to the steps described hereinabove, for example steps of depositing additional layers (not shown in FIGS. 5 and 6).

Figure 7:
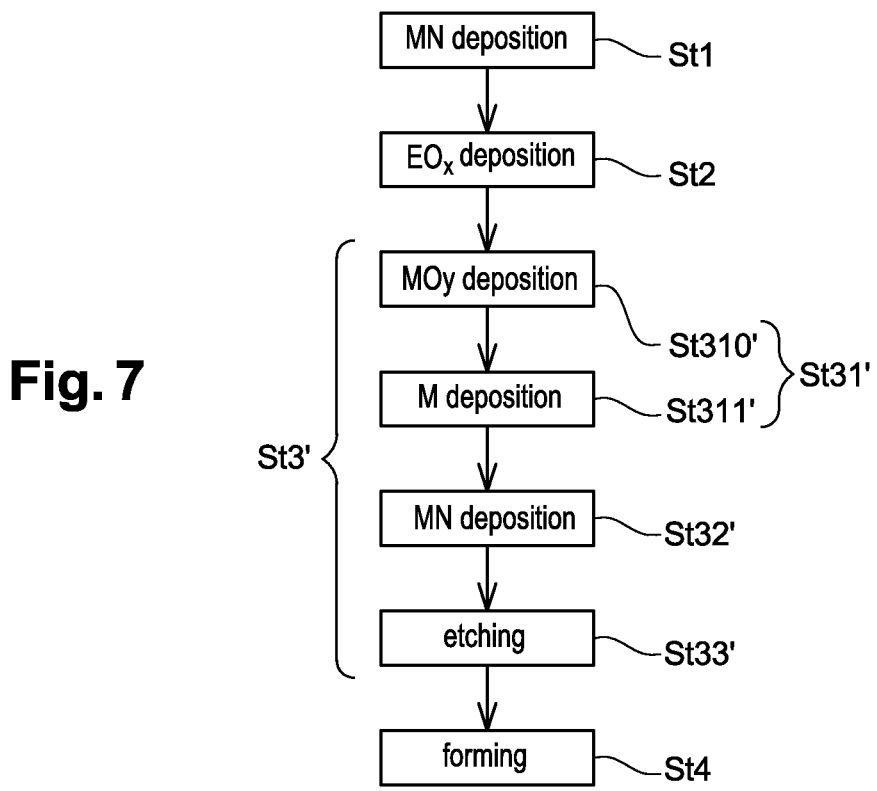
FIG. 7 schematically shows different steps of a second method of manufacturing an OxRAM resistive memory cell, in accordance with the teachings of the invention.

The second method of manufacturing a memory cell 80 in accordance with the invention is schematically shown in FIG. 7. As already indicated, during this second method, the reservoir layer 85 is carried out by successive depositions of different sub-layers, distinct from one another and comprising different proportions in oxygen.

The second method comprises the following steps:
step St1: depositing the lower electrode 2, then
step St2: depositing the active layer 84 on the lower electrode 2, active layer that here is entirely made of the first oxide EOx described hereinabove, then
step St3': producing the upper electrode 83 that covers the active layer 84, then
step St4: forming an electrically conductive filament in the active layer 84, by controlled electrical breakdown of the active layer (step of forming).

The steps St1, St2 and St4 are here identical, or at the very least substantially identical to the steps St1, St2 and St4 of the first method.

And the step St3', of producing the upper electrode 83, also comprises the following steps:
step St31': producing the reservoir layer 85, intended to be capable of receiving oxygen coming from the active layer;
step St32: depositing the protective layer 6 that covers the reservoir layer 55; 85, and
step St33: etching the upper electrode 83, as well as the active layer 84, in such a way as to laterally delimit the memory cell 80.

But the step St31' of producing the reservoir layer 85, based on successive depositions of different sub-layers (rather than on an annealing with diffusion of oxygen), is indeed different from the step St31 of the first method.

Here, the step St31' more precisely comprises the following sub-steps:
St310': depositing of a first sub-layer forming the lower part 852 of the reservoir layer 85, then
St311' depositing a second sub-layer, that covers the first sub-layer 852 and that forms the upper part 851 of the reservoir layer 85.

The first sub-layer 852 is made of the second oxide MOy. It is deposited for example by cathodic sputtering. This cathodic sputtering can be carried out from a target which is itself made of the second oxide MOy. The cathodic sputtering can also be carried out from a target made of the metal M, but under an atmosphere comprising oxygen. In this latter case, the oxygen partial pressure in the atmosphere in question, in the chamber where the deposition is carried out, is such that the first sub-layer 852 deposited is effectively made of the second oxide MOy, with the desired proportion in oxygen y (i.e. such that the second oxide MOy is electrically conductive).

Here again, after etching, the lower part 852 of the reservoir layer 85 has a section with surface area $A_{ox,8}$ that is larger than the surface area $A_M$ of a section of the upper part 851 made of the metal M (see FIG. 8).

This second method of manufacturing too can comprise additional steps, in addition to the steps described hereinabove, for example steps of depositing additional layers (not shown in FIG. 8), or a step of structuring the lower electrode 2, carried out for example between the deposition of the lower electrode 2 (step St1) and the deposition of the active layer (step St2).

Figure 1:
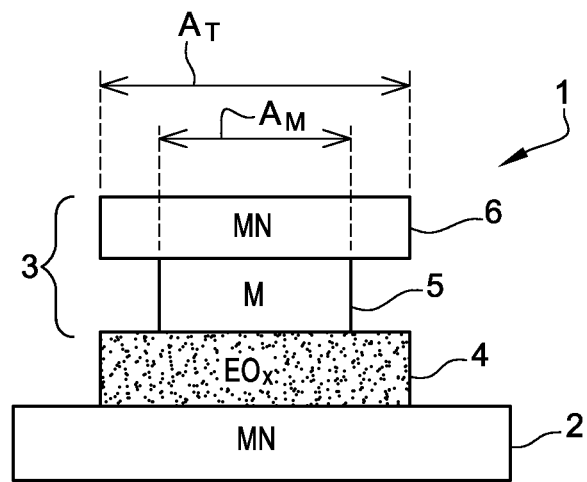
FIG. 1 is a schematic representation of an OxRAM resistive memory cell of the prior art, seen from the side.
Figure 9:
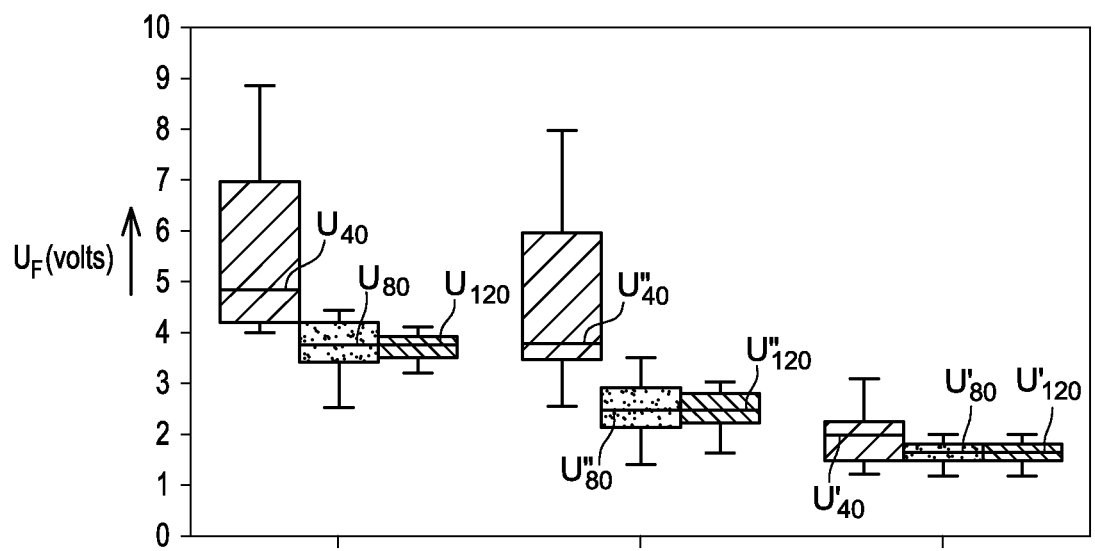
FIG. 9 shows values of forming voltage obtained for memory cells of the prior art, such as that of FIG. 1, and for memory cells in accordance with the teachings of the invention, obtained thanks to the method of FIG. 2.

FIG. 9 shows values of the forming voltage $U_F$ obtained:
- for memory cells for which the reservoir layer is made only of the metal M (values $U_{40}$, $U_{80}$ and $U_{120}$), as it is the case for the memory cell 1 of the prior art shown in FIG. 1, and
- for memory cells in according to the invention, for which the lower part of the reservoir layer is made of the conductive second oxide MOy (values $U'_{40}$, $U'_{80}$ and $U'_{120}$).

Here, the different values of the forming voltage $U_F$ shown in FIG. 9 correspond to memory cells wherein the metal M is titanium Ti, and wherein the first oxide EOx of the active layer is silicon oxide $SiO_2$. These values correspond to different sizes of the memory cells, the upper face of the cell having a diameter that is respectively about 40, 80 and 120 nanometres.

The values $U'_{40}$, $U'_{80}$ and $U'_{120}$ are values of the forming voltage $U_F$ obtained for memory cells in accordance with the invention (such as that of FIG. 5, or of FIG. 6), carried out by annealing by means of the first method of manufacturing described hereinabove. It is reminded that the annealing in question is carried out before the etching of the cell, but after the deposition of the layer 35 made of metal M, a layer that is intended to become the reservoir layer 55; 65 (the annealing is carried out after the deposition of the layer 35, so as to allow for the formation of a conductive oxide MOy, in this layer). The values $U'_{40}$, $U'_{80}$ and $U'_{120}$ correspond to diameters of the upper face of the cell of 40, 80 and 120 nanometres respectively.

Regarding the values $U''_{40}$, $U''_{80}$ and $U''_{120}$, these are values of the forming voltage $U_F$ obtained for memory cells carried out as in the case of FIG. 1, but with an annealing, this annealing being done before the deposition of the reservoir layer 5 made of metal M. The values $U''_{40}$, $U''_{80}$ and $U''_{120}$ correspond here too to diameters of the upper face of the cell of 40, 80 and 120 nanometres respectively.

Except for the differences indicated hereinabove (which relate to the carrying out or not of an annealing), the different memory cells, of which the values of forming voltage are given in FIG. 9, are manufactured in the same way.

The example of FIG. 9 shows that the values $U'_{40}$, $U'_{80}$ and $U'_{120}$ of the forming voltage $U_F$, obtained with a reservoir layer the lower part of which is made of the second oxide conductor MOy, are much less than those, $U_{40}$, $U_{80}$ and $U_{120}$ obtained with a conventional reservoir layer made only of the metal M.

By way of example, for a memory cell having an upper face of about 40 nanometres in diameter:
- the value $U_{40}$ of the forming voltage, with a reservoir layer made only of the metal M (memory cell of FIG. 1), is about 4.8 volts,
- while the value $U'_{40}$ of the forming voltage, obtained for a memory cell carried out in accordance with the first method (memory cell of FIG. 5, or 6), is only 2 volts.

Note that the drop in forming voltage observed cannot be explained solely by a modification of the active layer 54; 64 due to the annealing. Indeed, when the annealing is carried out before the deposition of the layer 35 made of metal M (and therefore when it affects only the active layer, not the reservoir layer), values $U''_{40}$, $U''_{80}$ and $U''_{120}$ of forming voltage are obtained that certainly are lower than in the absence of annealing, but which nevertheless remain higher than that what is obtained when the annealing is carried out after the deposition of the layer 35 made of metal M.

For the memory cell whose upper face has a diameter of about 40 nanometres, for example, the value $U''_{40}$ of the forming voltage is about 3.7 volts when the annealing is carried out before the deposition of the layer 35 made of metal, while a value $U'_{40}$ of only 2 volts is obtained when the annealing is carried out after the deposition of the layer 35 made of metal M (layer which in the end forms the reservoir layer).

FIGS. 10 and 11 show the results of an endurance test conducted respectively for a memory cell of the prior art, such as that of FIG. 1 (FIG. 10), and for a memory cell carried out in accordance with the method of FIG. 2 (such as the memory cell 50 of FIG. 50, or that, 60, of FIG. 6).

Each one of these figures shows the values of a low resistance $R_L$, and of a high resistance $R_H$ of the memory cell considered, during ten thousand successive write and reset cycles of the memory cell.

The high resistance $R_H$ of the memory cell is its electrical resistance, measured between the lower electrode 2 and the upper layer 6 of the upper electrode, when the conductive filament that passes through the active layer is broken (i.e. after a step of resetting—RESET step—of the memory cell).

The low resistance $R_L$ of the memory cell is its electrical resistance, measured between the lower electrode and the upper layer of the upper electrode, when the conductive filament has been reformed (i.e. after a step of writing—SET step—of the memory cell).

For the memory cell of FIG. 1, the values of the low resistance $R_L$ remain stable, around 3 kiloohms, during successive write and reset cycles (see FIG. 10). Regarding the values of the high resistance $R_H$, they increase progressively during write and reset cycles, starting at about 6 kiloohms and then stabilise, after about a thousand cycles, around 40 kiloohms.

For the memory cell of FIG. 5 (or 6), the values of the low resistance $R_L$ remain also stable, around 5 kiloohms, during successive write and reset cycles (see FIG. 11). The values of the high resistance $R_H$, equal to about 20 kiloohms, remain also stable during successive write and reset cycles. A ratio $R_H/R_L$ between the high resistance and the low resistance, that is rather high, of about 4, is therefore obtained, this ratio remaining very stable during these many write and reset cycles. The substantial and stable difference thus obtained between the high resistance $R_H$ and the low resistance $R_L$ facilitates the reading of the memory cell proposed here, and increases the reliability of this reading.

The invention claimed is:

1. An OxRAM (Oxide-based resistive Random Access Memory) resistive memory cell comprising a lower electrode, an upper electrode, and an active layer which extends between the lower electrode and the upper electrode,
   the active layer comprising at least one layer of a first electrically insulating oxide, wherein an electrically conductive filament is able to be formed, then subsequently broken and reformed several times successively,
   the upper electrode comprising a reservoir layer capable of receiving oxygen, a portion at least of the reservoir layer being made of a metal, wherein said reservoir layer comprises an upper part made of said metal and a lower part made of a second oxide, the second oxide being an oxide of said metal and comprising a proportion of oxygen such that the second oxide is electrically conductive, with an electrical conductivity greater than 100 Siemens per meter.

2. The OxRAM resistive memory cell according to claim 1, wherein the reservoir layer comprises a proportion of oxygen that varies progressively from the lower part of the reservoir layer to its upper part.

3. The OxRAM resistive memory cell according to claim 1, wherein:
the lower part of the reservoir layer is a first sub-layer made of said second oxide, and wherein
the upper part of the reservoir layer is a second sub-layer, distinct from the first sub-layer and made of said metal.

4. The OxRAM resistive memory cell according to claim 1, the cell having been delimited laterally by etching, wherein the lower part of the reservoir layer, made of the second oxide, has a section that is larger than a section of the upper part of the reservoir layer, made of said metal.

5. The OxRAM resistive memory cell according to claim 1, wherein said metal is one of the following metals: Titanium, Lanthanum, Aluminium, Zirconium, Hafnium, Gadolinium, Tantalum.

6. The OxRAM resistive memory cell according to claim 1, wherein the first electrically insulating oxide is an oxide of a chemical element different from said metal.

7. The OxRAM resistive memory cell according to claim 1, wherein said metal is Titanium and wherein the proportion of oxygen in the second oxide is less than 1.7 Oxygen atoms per Titanium atom.

8. The OxRAM resistive memory cell according to claim 1, wherein the first electrically insulating oxide is a Silicon oxide.

* * * * *

UNITED STATES PATENT AND TRADEMARK OFFICE
CERTIFICATE OF CORRECTION

PATENT NO.         : 12,349,609 B2                               Page 1 of 1
APPLICATION NO.    : 17/777494
DATED              : July 1, 2025
INVENTOR(S)        : Gabriel Molas et al.

It is certified that error appears in the above-identified patent and that said Letters Patent is hereby corrected as shown below:

On the Title Page

Item (73) Assignees: the first Assignee name should read:
COMMISSARIAT A L'ENERGIE ATOMIQUE ET AUX ENERGIES ALTERNATIVES Signed and Sealed this
Fifth Day of August, 2025

Coke Morgan Stewart
*Acting Director of the United States Patent and Trademark Office*